United States Patent
Chen et al.

(10) Patent No.: US 7,378,343 B2
(45) Date of Patent: May 27, 2008

(54) DUAL DAMASCENCE PROCESS UTILIZING TEOS-BASED SILICON OXIDE CAP LAYER HAVING REDUCED CARBON CONTENT

(75) Inventors: Jei-Ming Chen, Taipei Hsien (TW); Miao-Chun Lin, Tainan Hsien (TW); Kuo-Chih Lai, Tai-Nan (TW); Mei-Ling Chen, Kao-Hsiung (TW); Cheng-Ming Weng, Hsin-Chu Hsien (TW); Chun-Jen Huang, Tainan Hsien (TW); Yu-Tsung Lai, Tai-Chung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 421 days.

(21) Appl. No.: 11/164,285

(22) Filed: Nov. 17, 2005

(65) Prior Publication Data

US 2007/0111514 A1 May 17, 2007

(51) Int. Cl.
*H01L 21/4763* (2006.01)
(52) U.S. Cl. ...................... 438/638; 438/624; 438/700; 257/E21.579

(58) Field of Classification Search ................ 438/622, 438/624, 637–638, 640, 687, 700–702; 257/E21.579
See application file for complete search history.

(56) References Cited

U.S. PATENT DOCUMENTS

2006/0154086 A1* 7/2006 Fuller et al. ................ 428/428

* cited by examiner

*Primary Examiner*—Thanhha Pham
(74) *Attorney, Agent, or Firm*—Winston Hsu

(57) ABSTRACT

A dual damascene process starts with providing a substrate having thereon a base layer, a lower copper wiring inlaid into the base layer, and a lower cap layer covering the inlaid lower copper wiring. A dielectric layer is deposited on the lower cap layer. A TEOS-based oxide cap layer is deposited on the dielectric layer. The TEOS-based oxide cap layer has a carbon content lower than $1 \times 10^{19}$ atoms/cm$^3$. A metal hard mask is deposited on the TEOS-based oxide cap layer. A trench recess is etched into the metal hard mask and the TEOS-based oxide cap layer. A partial via feature is then etched into the TEOS-based oxide cap layer and the dielectric layer through the trench recess. The trench recess and partial via feature are etch transferred into the underlying dielectric layer, thereby forming a dual damascene opening, which exposes a portion of the lower copper wiring.

20 Claims, 11 Drawing Sheets

DUAL DAMASCENCE PROCESS UTILIZING TEOS-BASED SILICON OXIDE CAP LAYER HAVING REDUCED CARBON CONTENT

BACKGROUND OF THE INVENTION

1. Field of the Invention

The present invention relates generally to copper interconnects. More particularly, the present invention relates to a partial-via-first copper dual damascene process utilizing a TEOS-based oxide cap layer having reduced carbon content, which is capable solving via self-etching stop problem.

2. Description of the Prior Art

Damascene interconnect processes incorporated with copper are known in the art, which are also referred to as "copper damascene processes" in the semiconductor industry. The copper damascene processes provide a solution to form a conductive wire coupled with an integral via plug without the need of dry etching copper. Either a single damascene or a dual damascene structure is used to connect devices and/or wires of an integrated circuit. Generally, the dual damascene process encompasses trench-first, via-first, partial-via-first, and self-aligned processes.

FIGS. 1-5 are schematic, cross-sectional diagrams showing a conventional partial-via-first dual damascene process. As shown in FIG. 1, a substrate 1 having thereon a base layer or a lower low-k dielectric layer 10 is provided. A lower copper wiring 12 is inlaid into the lower low-k dielectric layer 10. The lower copper wiring 12 and the low-k dielectric layer 10 are covered with a lower cap layer 14. A low-k dielectric layer 16, a silicon oxide cap layer 18, a metal hard mask layer 20 and a bottom anti-reflective coating (BARC) layer 22 are sequentially deposited on the lower cap layer 14. A layer of photoresist (Trench Photo) 30 having a trench opening 32 therein is formed on the BARC layer 22.

Subsequently, as shown in FIG. 2, a dry etching process is carried out. A trench recess 36 is etched into the metal hard mask layer 20 and the silicon oxide cap layer 18 through the trench opening 32. The dry etching stops on the silicon oxide cap layer 18. The remaining photoresist 30 and BARC layer 22 are then stripped off.

As shown in FIG. 3, another BARC layer 38 is coated over the substrate 1 and fills the trench recess 36. A layer of photoresist (Via Photo) 40 is then formed on the BARC layer 38. The photoresist layer 40 has a via opening 42 patterned by using conventional lithographic methods. The via opening 42 is situated directly above the trench recess 36.

As shown in FIG. 4, using the photoresist layer 40 as an etching hard mask, the BARC layer 38, the silicon oxide cap layer 18, and the lower low-k dielectric layer 16 are etched through the via opening 42, thereby forming a partial via feature 46 in an upper portion of the dielectric layer 16. The remaining photoresist layer 40 and the BARC layer 38 are stripped off by using oxygen plasma.

As shown in FIG. 5, using the metal hard mask layer 20 as an etching hard mask, a dry etching is performed to etch away the silicon oxide cap layer 18 and the lower low-k dielectric layer 16 through the trench recess 36 and the partial via 46, thereby forming a dual damascene opening 50 comprising a trench opening 56 and a via opening 66.

The via opening 66 is supposed to expose a portion of the underlying inlaid copper wiring 12. However, as indicated in FIG. 5, as the critical dimension of the via hole shrinks to 90 nanometers or beyond, the via etching stops before the lower copper wiring 12, and thus fails to open the lower copper wiring 12. This via self-etching stop problem becomes worse when the via opening is an isolated via.

In light of the above, there is a need in this industry to provide an improved method of forming dual damascene structure in the fabrication of integrated circuits, which is capable of solving the aforesaid via self-etching stop problem.

SUMMARY OF THE INVENTION

It is one object of the present invention to provide an improved copper dual damascene method, which is capable solving the above described via self-etching stop problem.

According to the claimed invention, a partial-via-first dual damascene process is disclosed. The partial-via-first dual damascene process starts with providing a substrate having thereon a base layer, a lower copper wiring inlaid into the base layer, and a lower cap layer covering the base layer and the inlaid lower copper wiring. A dielectric layer is deposited on the lower cap layer. A TEOS-based silicon oxide cap layer is then deposited on the dielectric layer. The TEOS-based silicon oxide cap layer has a carbon content lower than $1 \times 10^{19}$ atoms/cm$^3$. A metal hard mask is deposited on the TEOS-based silicon oxide cap layer. A trench recess is etched into the metal hard mask and the TEOS-based silicon oxide cap layer. A partial via feature is then etched into the TEOS-based silicon oxide cap layer and the dielectric layer through the trench recess. The trench recess and partial via feature are etch transferred into the underlying dielectric layer, thereby forming a dual damascene opening, which exposes a portion of the lower copper wiring.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
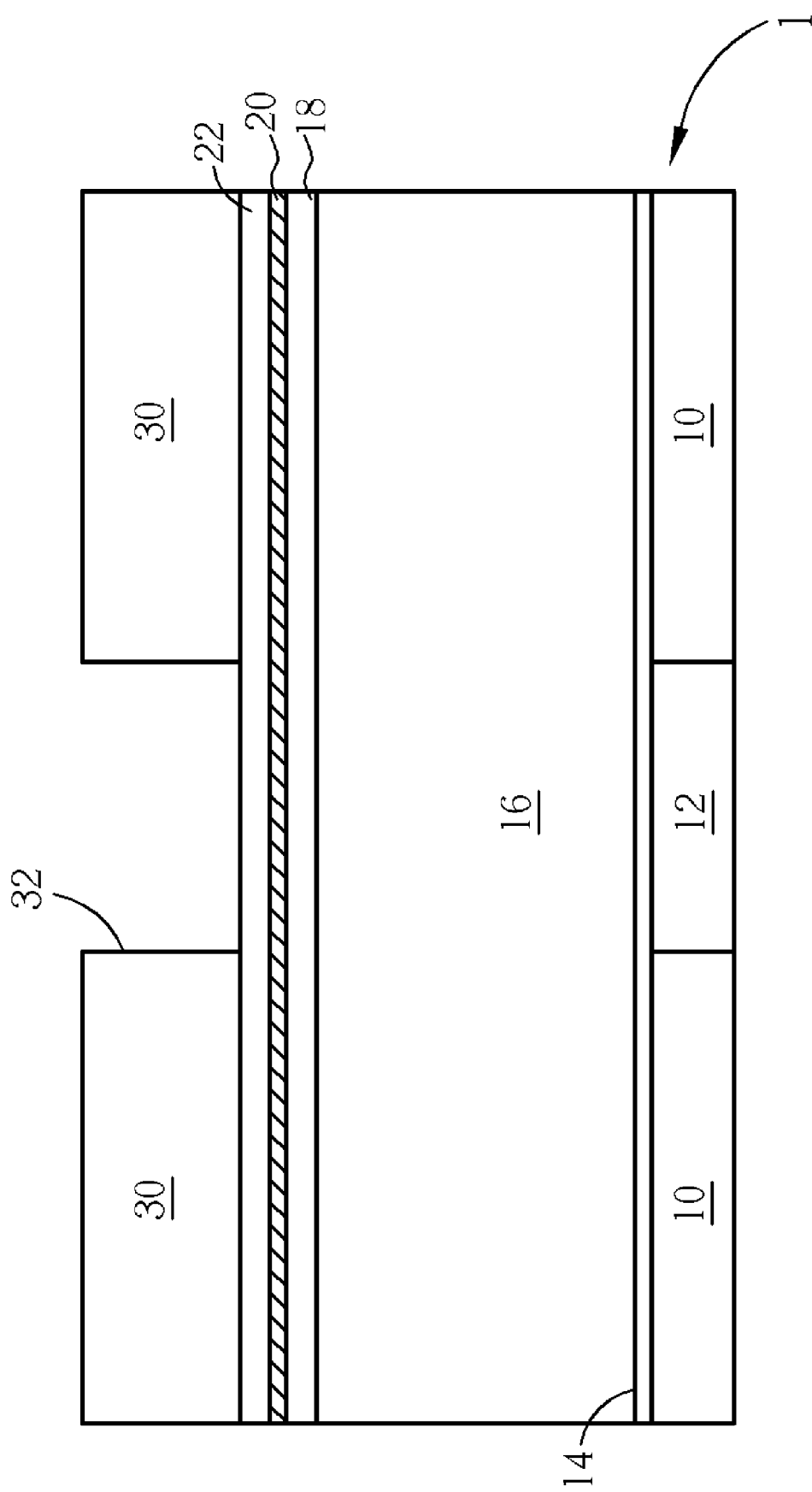
FIGS. 1-5 are schematic, cross-sectional diagrams showing a conventional partial-via-first dual damascene process.
Figure 2:
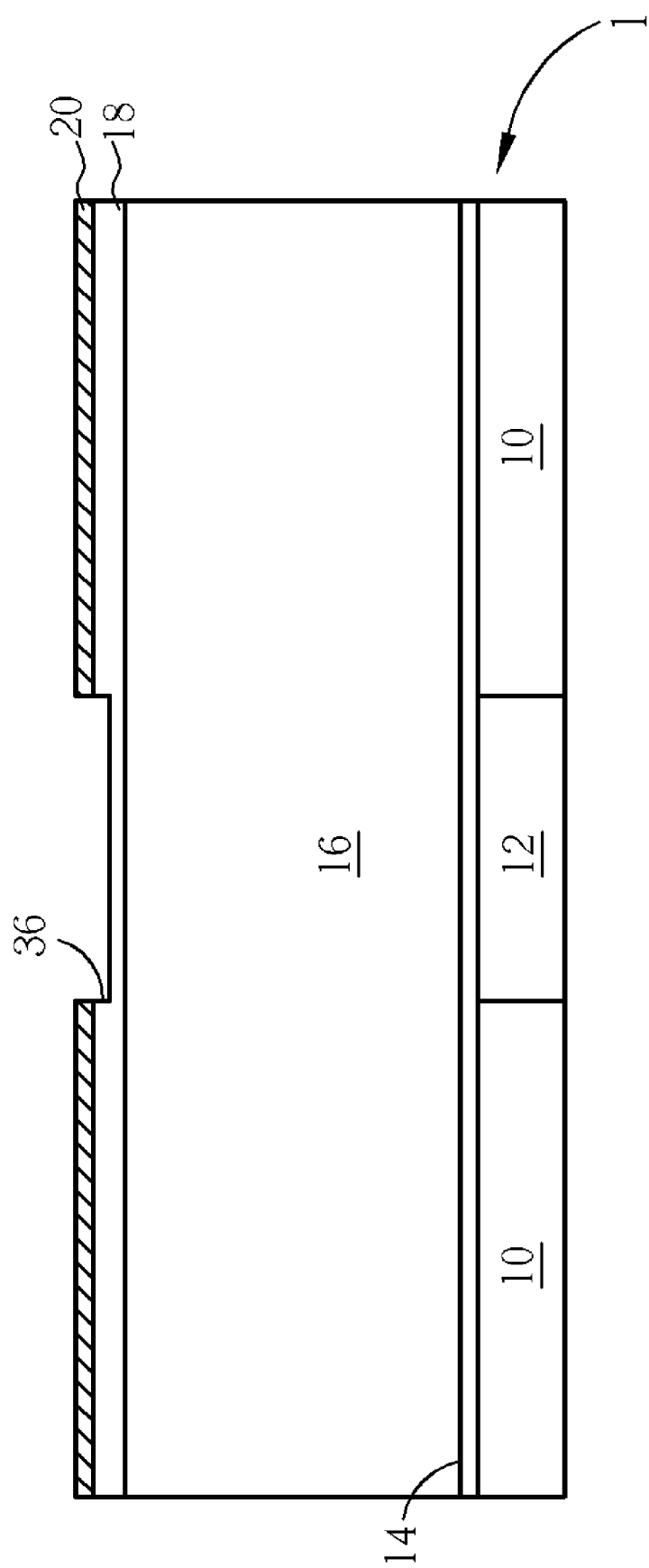
Figure 3:
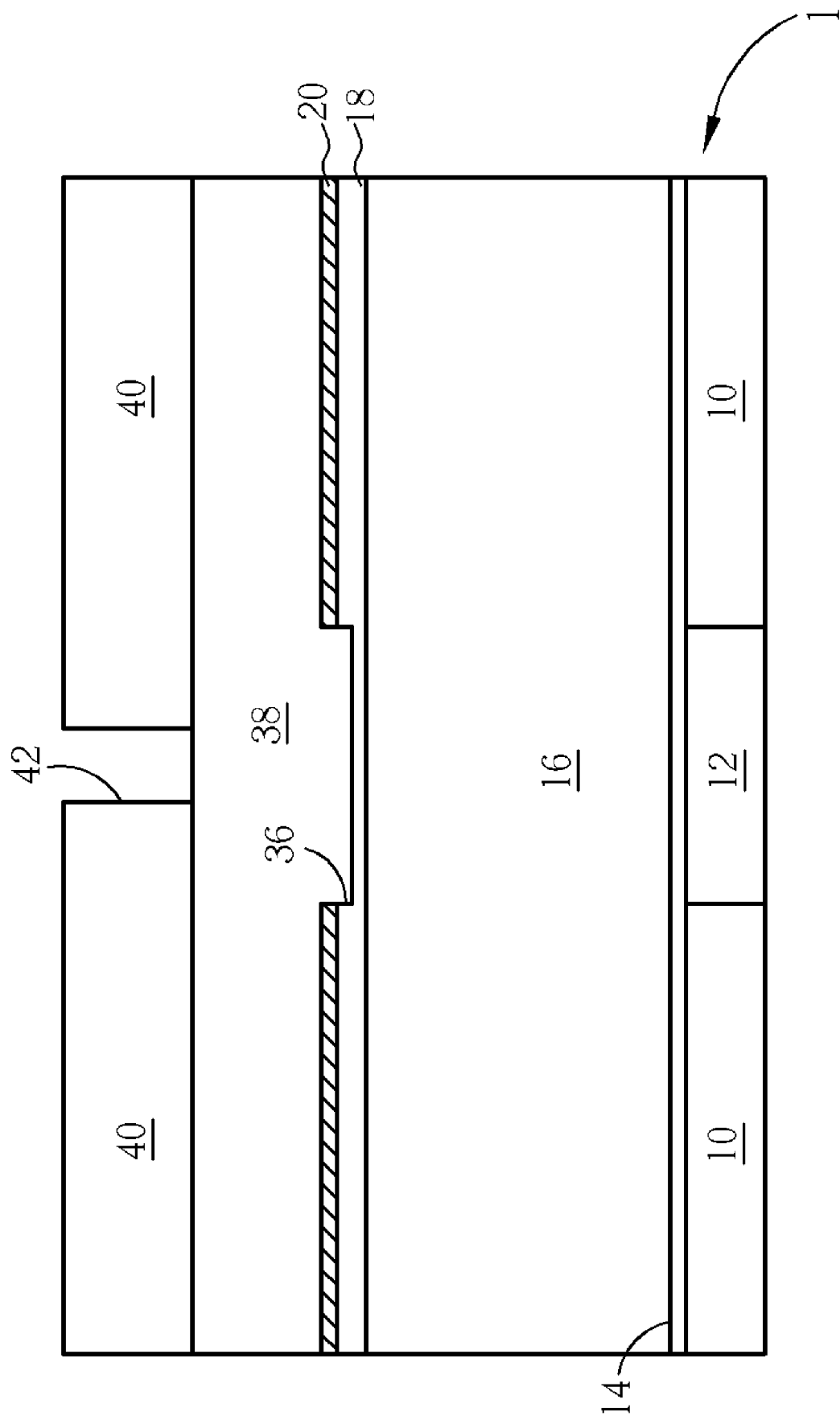
Figure 4:
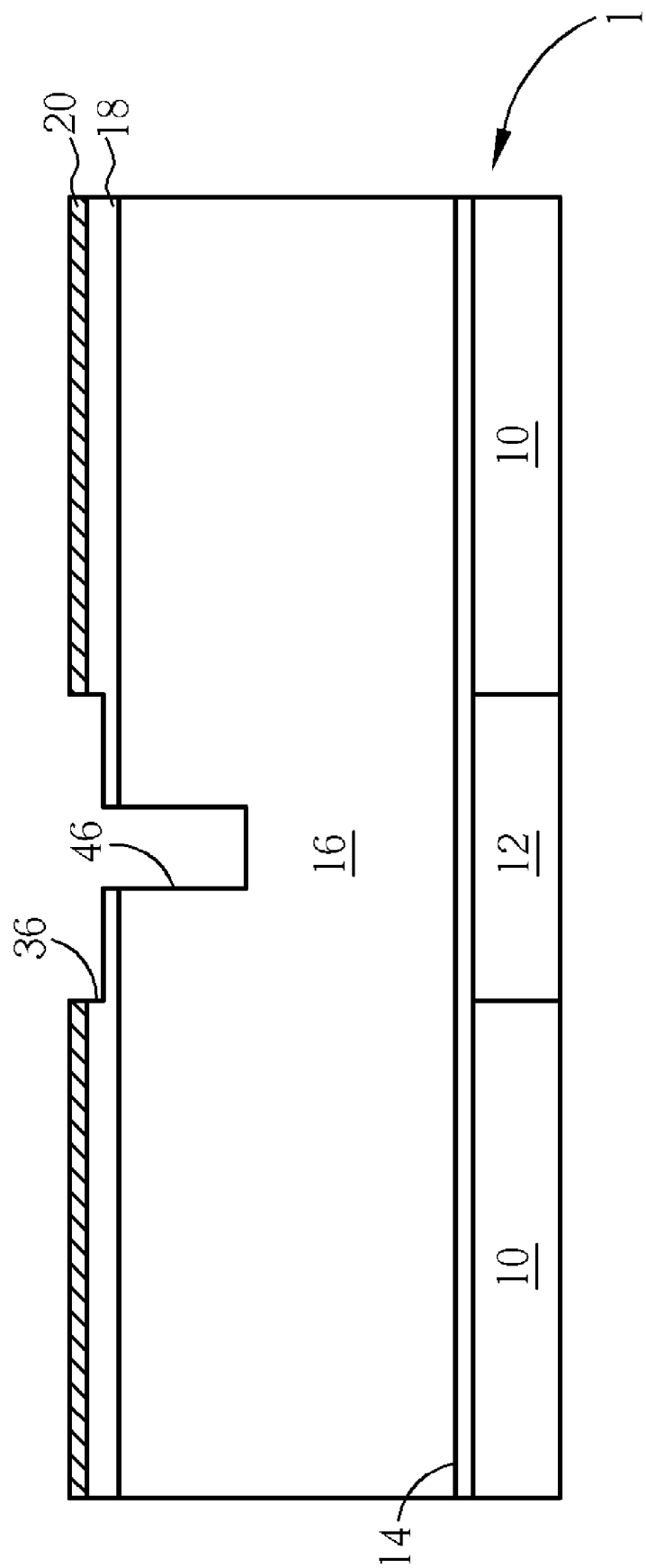
Figure 5:
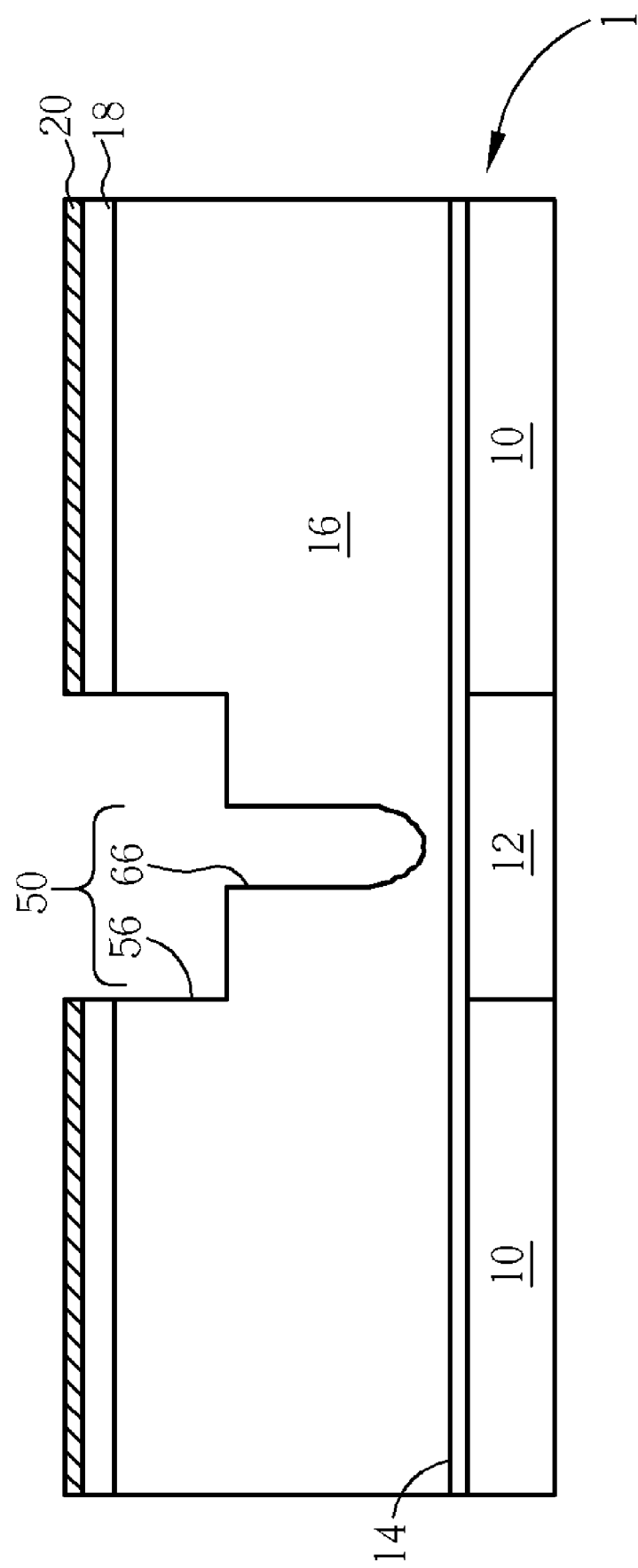
Figure 6:
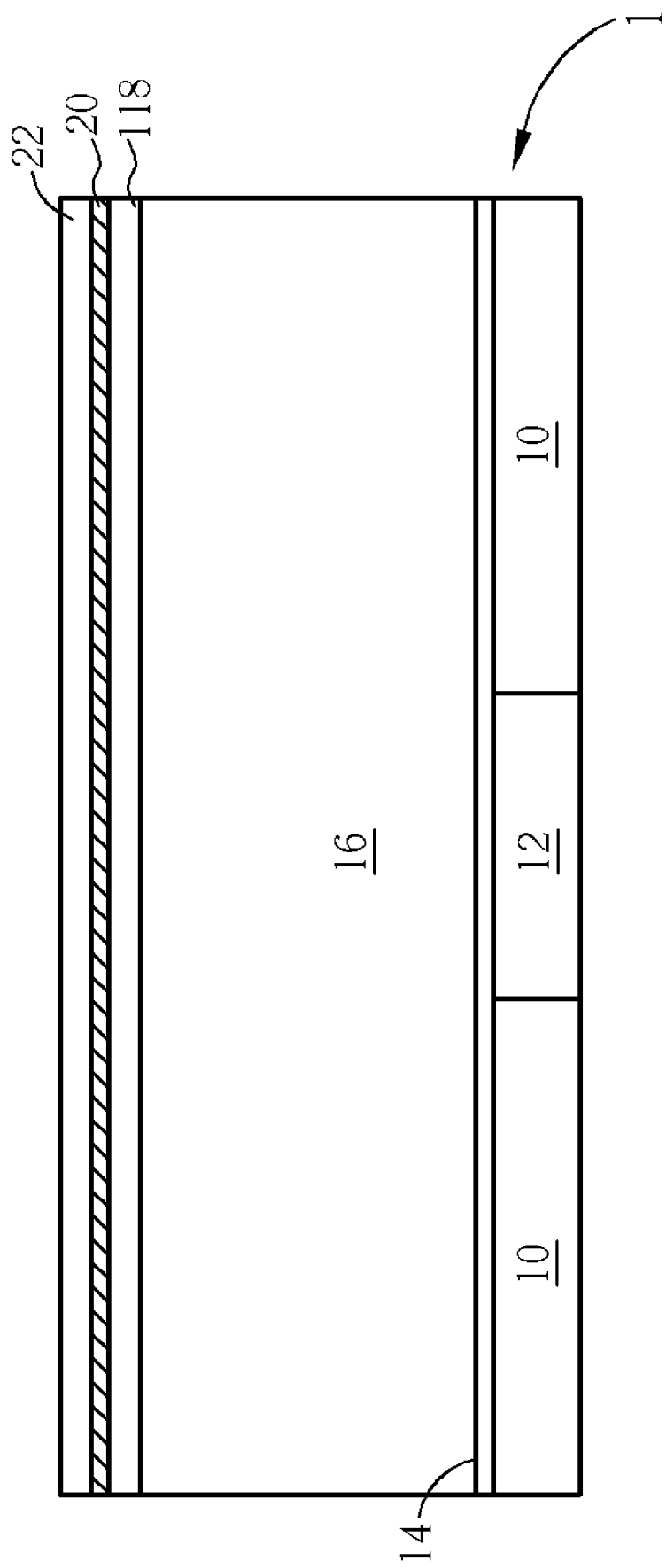
FIGS. 6-10 are schematic, cross-sectional diagrams showing a partial-via-first dual damascene process in accordance with one preferred embodiment of this invention.

FIGS. 6-10 are schematic, cross-sectional diagrams showing a partial-via-first dual damascene process according to one preferred embodiment of this invention, wherein like numeral numbers designate like elements, regions or layers. As shown in FIG. 6, a substrate 1 having thereon a base layer or a lower low-k dielectric layer 10 is provided. Likewise, a lower copper wiring 12 is inlaid into the lower low-k dielectric layer 10. The lower copper wiring 12 and the low-k dielectric layer 10 are covered with a lower cap layer 14. According to the preferred embodiment, the lower cap layer 14 is made, for example, of nitrogen doped silicon carbide (SiCN) and has a thickness of about 300-800 angstroms, preferably about 500 angstroms.

Subsequently, a low-k dielectric layer 16, a TEOS-based silicon oxide cap layer 118, a metal hard mask layer 20 and a bottom anti-reflective coating (BARC) layer 22 are sequentially deposited on the lower cap layer 14. Preferably, the metal hard mask layer 20 is made of titanium nitride (TiN), but not limited thereto. According to the preferred embodiment, the thickness of the metal hard mask layer 20 ranges between 250-450 angstroms, preferably about 300-350 angstroms.

The low-k dielectric layer 16 may include organosilicate glass (OSG), which is a silicon oxide that is doped with carbon and hydrogen atoms and has a k value between 2 and 3, thereby providing a needed reduction in capacitance coupling between wirings. Suitable low-k materials for the low-k dielectric layer 16 may include, for example, Black Diamond™ available from Applied Materials, CORAL™ from Novellus, among others. The thickness of the low-k dielectric layer 16 ranges between 2500-4500 angstroms, preferably about 3000-3500 angstroms.

The TEOS-based silicon oxide cap layer 118 is deposited by using a plasma-enhanced chemical vapor deposition (PECVD) method, wherein tetraethylorthosilicate precursor, oxygen ($O_2$) and a relatively higher $O_2$/TEOS ratio are employed. It is one salient feature of the present invention that the TEOS-based silicon oxide cap layer 118 has a carbon content is deliberately reduced to a level that is lower than $1\times10^{19}$ atoms/cm$^3$. It is postulated that high carbon content of the silicon oxide cap layer contributes to the prior art via self-etching stop problem. Experimental results have confirmed that by reducing the carbon content of the silicon oxide cap layer disposed underneath the metal hard mask layer 22, the aforesaid via self-etching stop problem can be effectively eliminated.

According to the preferred embodiment, the TEOS-based silicon oxide cap layer 118 having a reduced carbon content is deposited by employing the following process conditions: a pressure of about 3-8 Torr, preferably 5 Torr; a process temperature of about 100-450° C., preferably 350-400° C.; a high-frequency RF power of about 200-350 Watts, preferably 250-300 Watts, more preferably 280 Watts, for a duration of about 25 seconds; a low-frequency RF power (bias RF power) of about 30-70 Watts, preferably 40-60 Watts, more preferably about 50 Watts; TEOS precursor of about 0.2-5 gm; helium (carrier gas) flowrate of about 7500-9500 sccm, preferably 8500-9000 sccm; and oxygen ($O_2$) flowrate of about 5000-10000 sccm, preferably about 8000 sccm. The above-described PECVD process is carried out at relatively low deposition rate ranging between 800-4000 angstroms/minute. The TEOS-based silicon oxide cap layer 118 has a thickness of about 300-1000 angstroms, preferably 500 angstroms.

Figure 11:
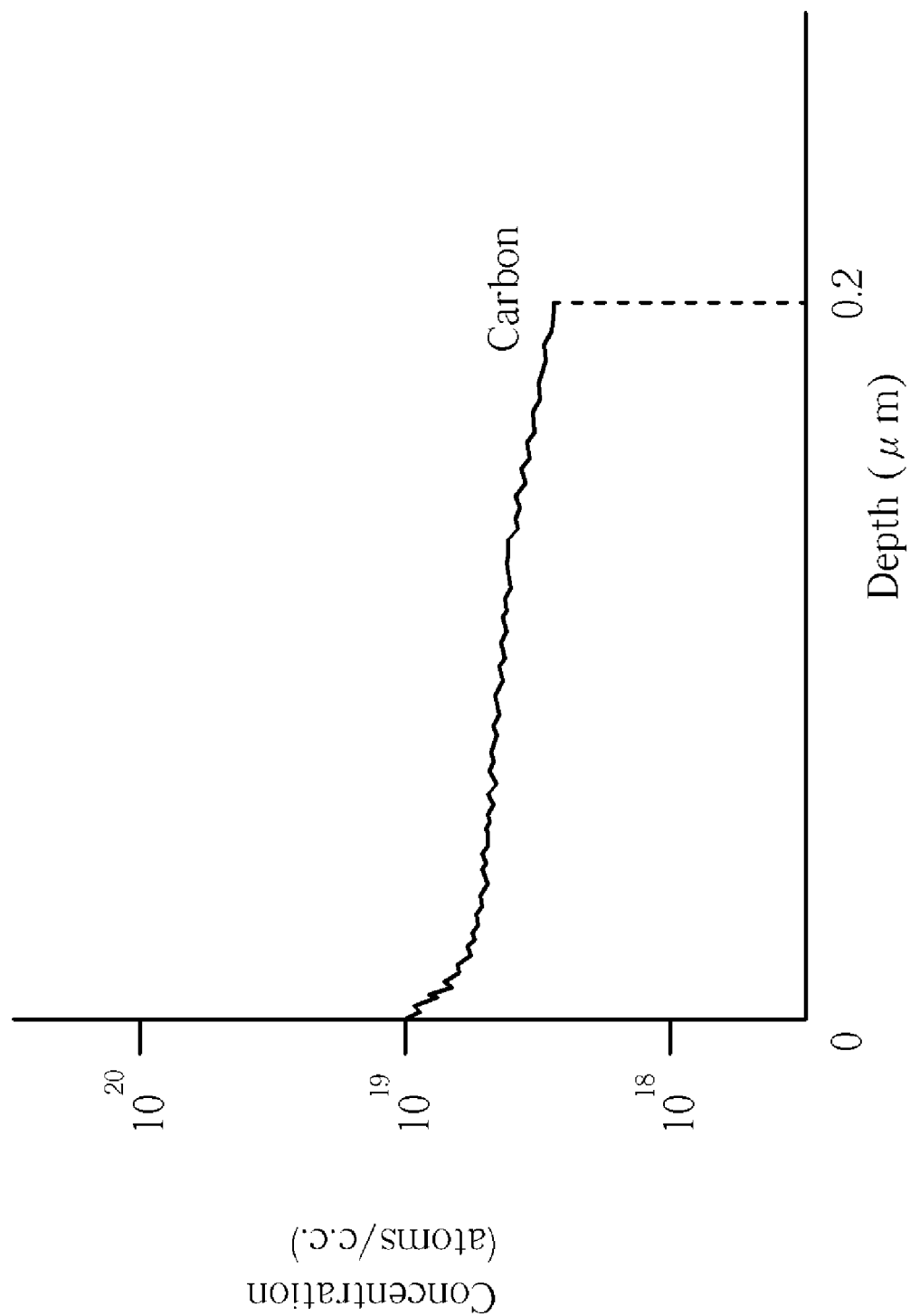
FIG. 11 is a plot demonstrating the carbon content of the TEOS-based silicon oxide cap layer based on the SIMS analysis.

Please refer briefly to FIG. 11. FIG. 11 is a plot demonstrating the carbon concentration in the TEOS-based silicon oxide cap layer based on the SIMS analysis using Cs$^+$ as ion source. According to the SIMS analysis, the deposited TEOS-based silicon oxide layer has highest carbon concentration at its surface and as it goes deeper the carbon concentration gradually reduces. It is another feature of the present invention that the TEOS-based silicon oxide cap layer has such a carbon distribution gradient.

Figure 7:
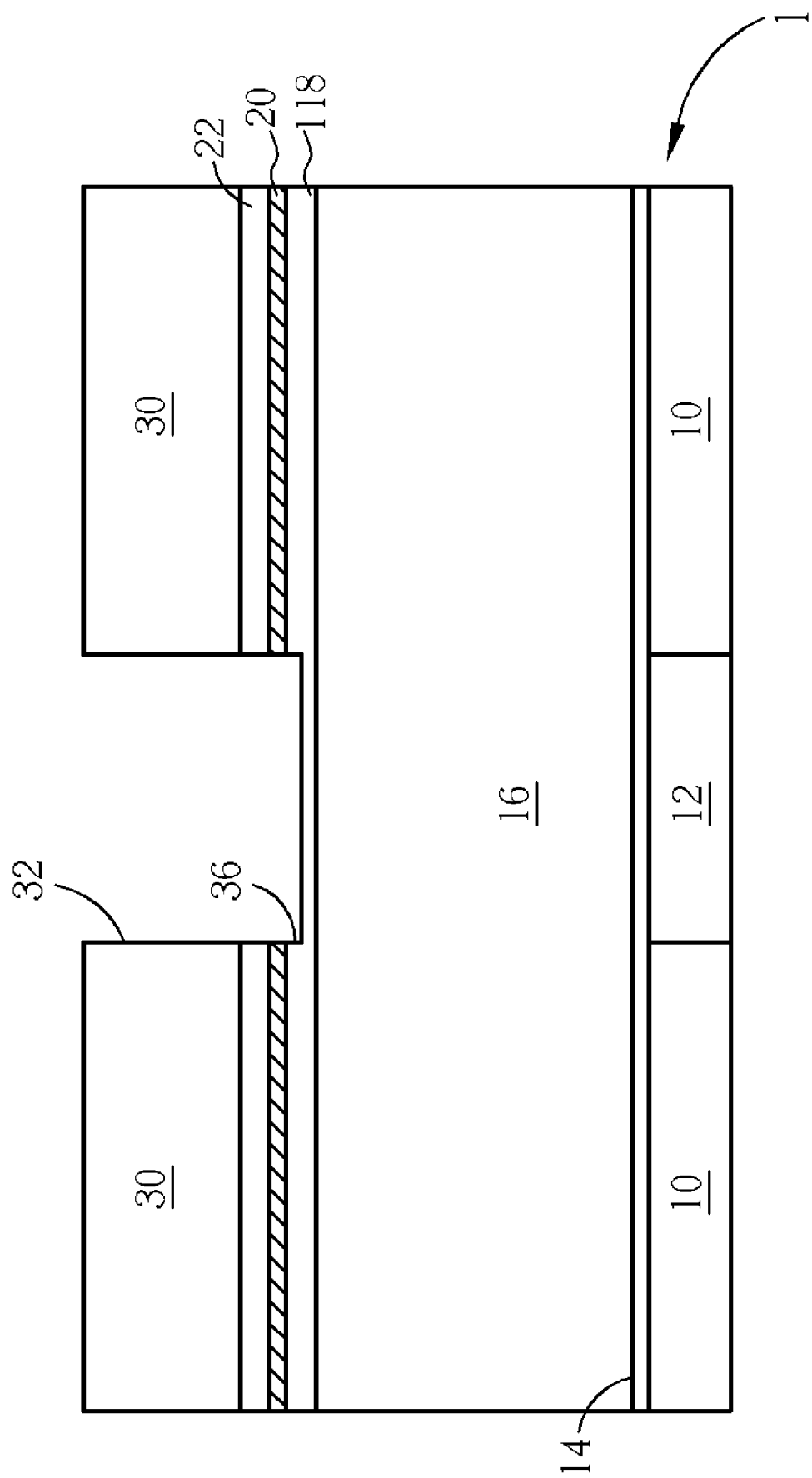

As shown in FIG. 7, a layer of photoresist (Trench Photo) 30 having a trench opening 32 therein is formed on the BARC layer 22. Subsequently, a dry etching process is carried out. A trench recess 36 is etched into the metal hard mask layer 20 and the TEOS-based silicon oxide cap layer 118 through the trench opening 32. The dry etching stops on the TEOS-based silicon oxide cap layer 118. The remaining photoresist 30 and BARC layer 22 are then stripped off. The photoresist 30 may be stripped with an oxygen containing plasma.

Figure 8:
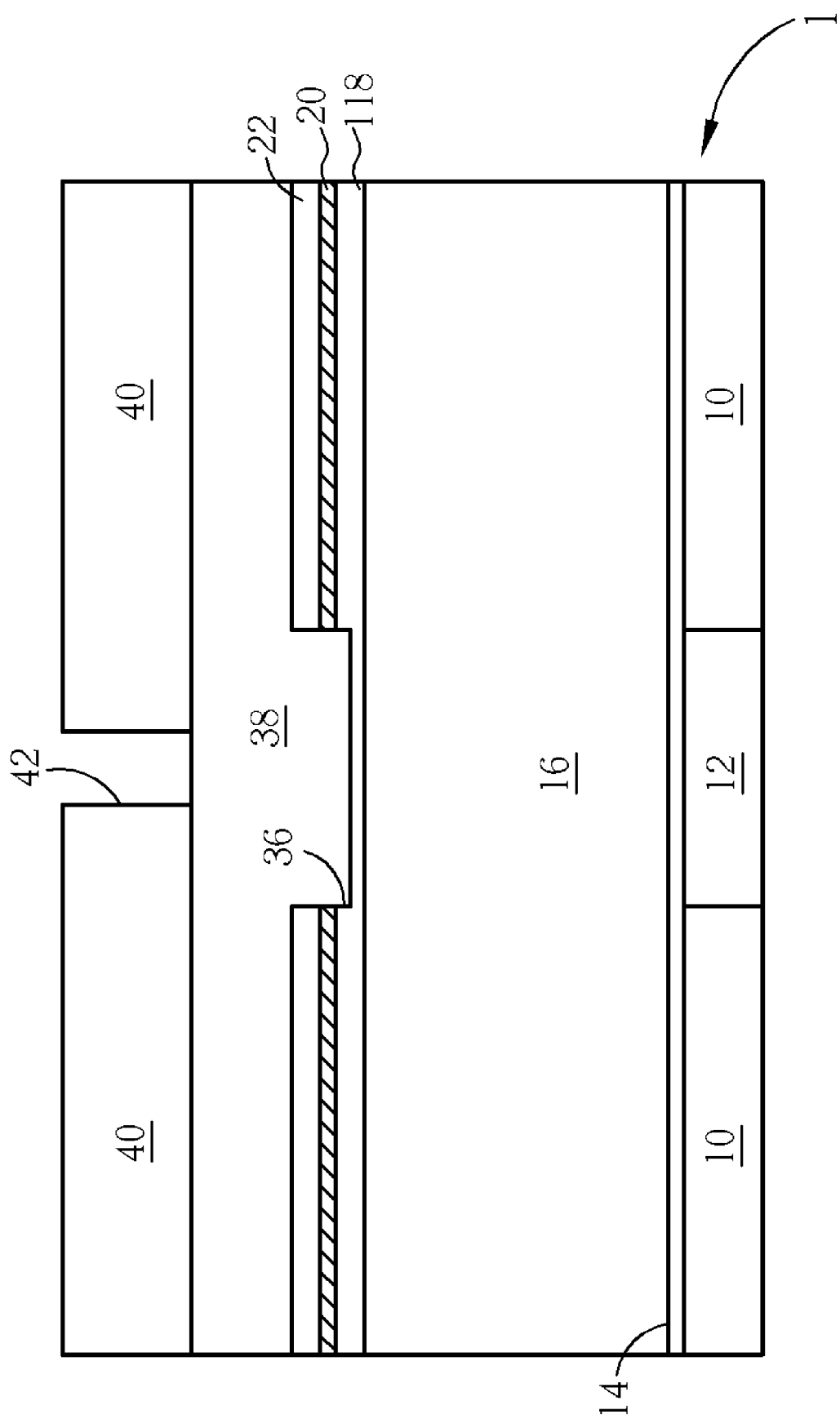

As shown in FIG. 8, another BARC layer 38 is coated over the substrate 1 and fills the trench recess 36. A layer of photoresist (Via Photo) 40 is then formed on the BARC layer 38. The photoresist layer 40 has a via opening 42 patterned by using conventional lithographic methods. The via opening 42 is situated directly above the trench recess 36.

Figure 9:
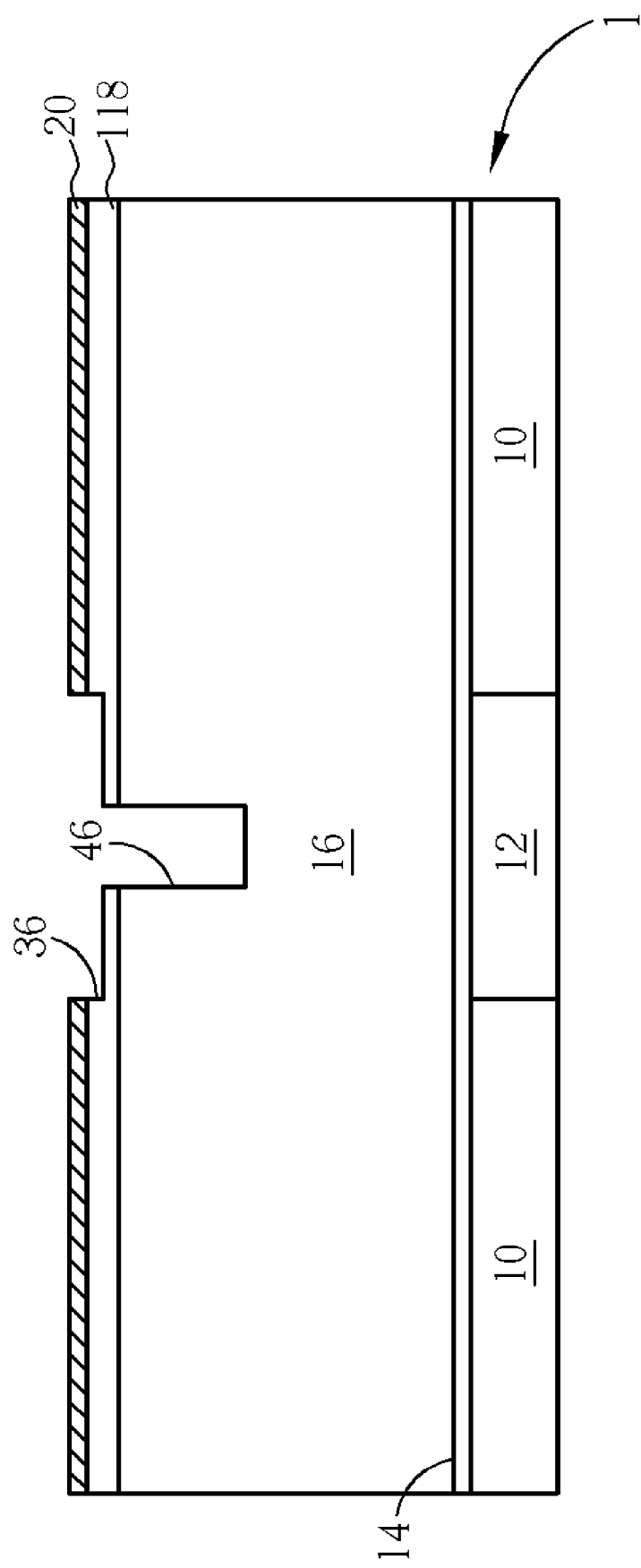

As shown in FIG. 9, using the photoresist layer 40 as an etching hard mask, the BARC layer 38, the TEOS-based silicon oxide cap layer 118, and the lower low-k dielectric layer 16 are etched through the via opening 42, thereby forming a partial via feature 46 in an upper portion of the dielectric layer 16. The remaining photoresist layer 40 and the BARC layer 38 are stripped off by using oxygen plasma. Alternatively, $H_2/N_2$ or $H_2$/He plasma may be employed to strip the photoresist layer 40.

Figure 10:
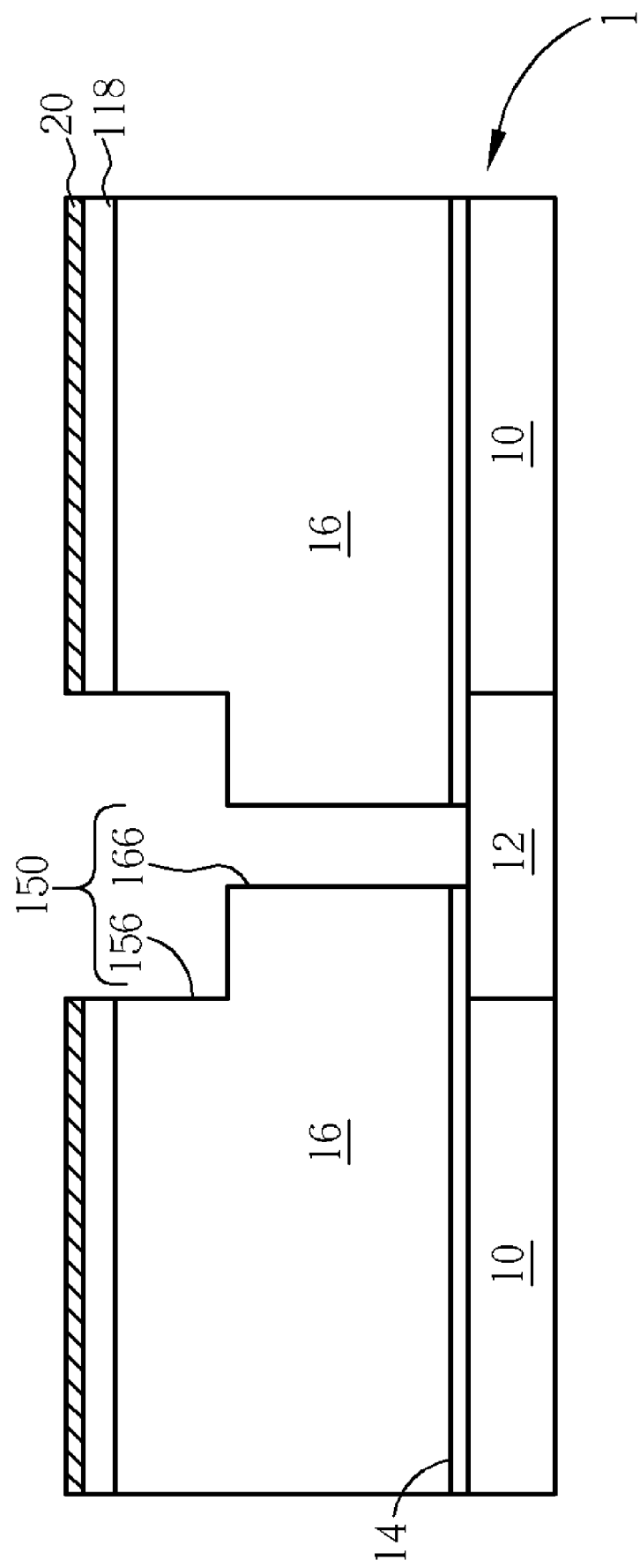

As shown in FIG. 10, using the metal hard mask layer 20 as an etching hard mask, a dry etching is performed to etch away the TEOS-based silicon oxide cap layer 118 and the lower low-k dielectric layer 16 through the trench recess 36 and the partial via 46, thereby forming a dual damascene opening 150 comprising a trench opening 156 and a via opening 166. The via opening 166 expose a portion of the underlying inlaid copper wiring 12.

According to another preferred embodiment, an oxygen plasma treatment may be carried out after the deposition of the TEOS-based silicon oxide cap layer 118 to expose the surface of the TEOS-based silicon oxide cap layer 118 to the oxygen plasma. By doing this, the carbon content of the TEOS-based silicon oxide cap layer 118 may be further reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dual damascene process, comprising:
providing a substrate having thereon a base layer, a lower conductive layer inlaid into said base layer, and a lower cap layer covering said base layer and said inlaid lower conductive layer;
depositing a dielectric layer on said lower cap layer;
depositing a TEOS-based silicon oxide cap layer on said dielectric layer, said TEOS-based silicon oxide cap layer having a carbon content lower than $1\times10^{19}$ atoms/cm$^3$;
depositing a metal hard mask on said TEOS-based silicon oxide cap layer;
etching a trench recess into said metal hard mask and said TEOS-based silicon oxide cap layer;
etching a partial via feature into said TEOS-based silicon oxide cap layer and said dielectric layer through said trench recess; and
etch transferring said trench recess and said partial via feature into said dielectric layer, thereby forming a dual damascene opening therein, which exposes a portion of said lower conductive layer.

2. The dual damascene process according to claim 1 wherein said TEOS-based silicon oxide cap layer is deposited by using a plasma-enhanced chemical vapor deposition (PECVD) process.

3. The dual damascene process according to claim 2 wherein said PECVD process is carried out at an oxygen ($O_2$) flowrate of about 5000-10000 sccm.

4. The dual damascene process according to claim 2 wherein said PECVD process is carried out at a TEOS precursor flowrate of about 0.2-5 gm.

5. The dual damascene process according to claim 2 wherein said PECVD process is carried out at a high-frequency RF power of about 200-350 Watts and a low-frequency RF power (bias RF power) of about 30-70 Watts.

6. The dual damascene process according to claim 2 wherein said PECVD process is carried out at a low deposition rate ranging between 800-4000 angstroms/minute.

7. The dual damascene process according to claim 1 wherein said TEOS-based silicon oxide cap layer has a thickness of about 300-1000 angstroms.

8. The dual damascene process according to claim 1 wherein said TEOS-based silicon oxide cap layer is post treated by using oxygen plasma.

9. The dual damascene process according to claim 1 wherein said dielectric layer has a dielectric constant k that is between 2 and 3.

10. The dual damascene process according to claim 1 wherein said metal hard mask comprises titanium nitride (TiN).

11. A dual damascene process, comprising:
providing a substrate having thereon a base layer, a lower copper wiring inlaid into said base layer, and a lower cap layer covering said base layer and said inlaid lower copper wiring;
depositing a dielectric layer on said lower cap layer;
depositing a TEOS-based silicon oxide cap layer on said dielectric layer, said TEOS-based silicon oxide cap layer having a carbon content lower than $1 \times 10^{19}$ atoms/$cm^3$ and a carbon concentration gradient across thickness of said TEOS-based silicon oxide cap layer;
depositing a metal hard mask on said TEOS-based silicon oxide cap layer;
etching a trench recess into said metal hard mask and said TEOS-based silicon oxide cap layer;
etching a partial via feature into said TEOS-based silicon oxide cap layer and said dielectric layer through said trench recess; and
etch transferring said trench recess and said partial via feature into said dielectric layer, thereby forming a dual damascene opening therein, which exposes a portion of said lower copper wiring.

12. The dual damascene process according to claim 11 wherein said TEOS-based silicon oxide cap layer is deposited by using a plasma-enhanced chemical vapor deposition (PECVD) process.

13. The dual damascene process according to claim 12 wherein said PECVD process is carried out at an oxygen ($O_2$) flowrate of about 5000-10000 sccm.

14. The dual damascene process according to claim 12 wherein said PECVD process is carried out at a TEOS precursor flowrate of about 0.2-5 gm.

15. The dual damascene process according to claim 12 wherein said PECVD process is carried out at a high-frequency RF power of about 200-350 Watts and a low-frequency RF power (bias RF power) of about 30-70 Watts.

16. The dual damascene process according to claim 12 wherein said PECVD process is carried out at a low deposition rate ranging between 800-4000 angstroms/minute.

17. The dual damascene process according to claim 11 wherein said TEOS-based silicon oxide cap layer has a thickness of about 300-1000 angstroms.

18. The dual damascene process according to claim 11 wherein said TEOS-based silicon oxide cap layer is post treated by using oxygen plasma.

19. The dual damascene process according to claim 11 wherein said dielectric layer has a dielectric constant k that is between 2 and 3.

20. The dual damascene process according to claim 11 wherein said metal hard mask comprises titanium nitride (TiN).

* * * * *